Figure 1:
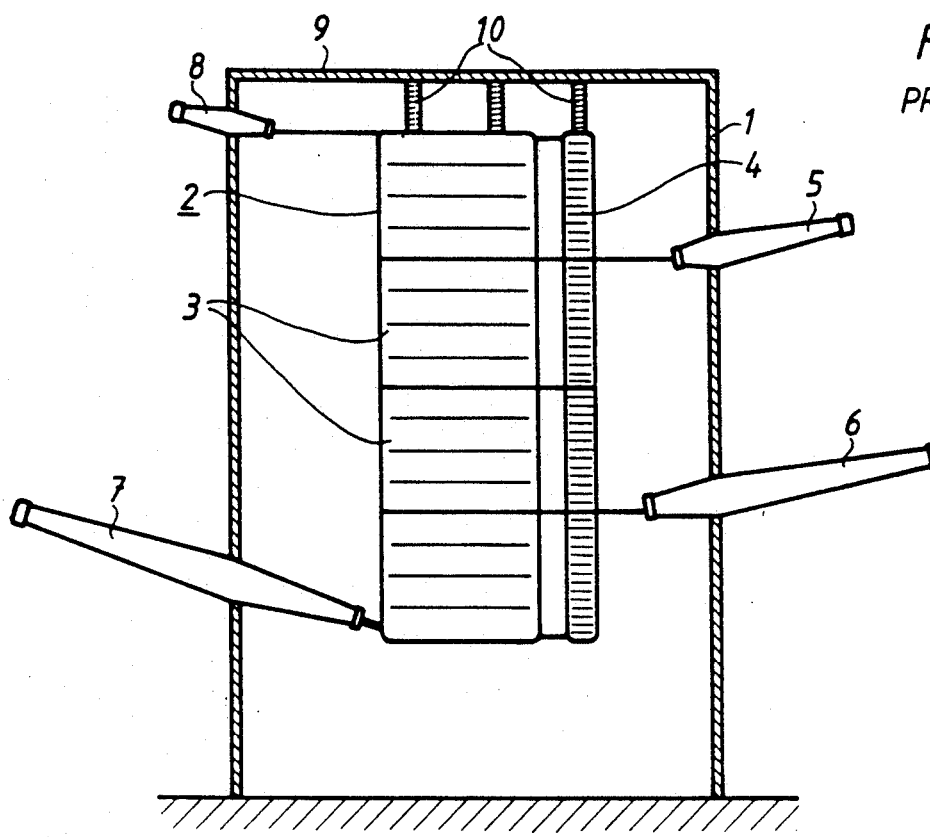

United States Patent [19]
Asplund et al.

[11] Patent Number: 5,249,114
[45] Date of Patent: Sep. 28, 1993

[54] ARRANGEMENT OF A VALVE STACK FOR HIGH VOLTAGE DIRECT CURRENT IN A VALVE HALL

[75] Inventors: Gunnar Asplund; Olle Ekwall, both of Ludvika, Sweden

[73] Assignee: ASEA Brown Boveri AB, VästerÅs, Sweden

[21] Appl. No.: 820,857

[22] PCT Filed: Jun. 29, 1990

[86] PCT No.: PCT/SE90/00468
§ 371 Date: Jan. 22, 1992
§ 102(e) Date: Jan. 22, 1992

[87] PCT Pub. No.: WO91/03087
PCT Pub. Date: Mar. 7, 1991

[30] Foreign Application Priority Data
Aug. 16, 1989 [SE] Sweden ............................... 8902744

[51] Int. Cl.⁵ .................................................. H02J 3/36
[52] U.S. Cl. ........................................... 363/35; 363/68; 363/125; 363/144; 257/177
[58] Field of Search ................................. 363/67–69, 363/144, 13, 35, 125–129, 123; 174/50; 257/177, 678, 723

[56] References Cited
U.S. PATENT DOCUMENTS

| | | | |
|---|---|---|---|
| 4,090,233 | 5/1978 | Thiele et al. | 363/68 |
| 4,318,169 | 3/1982 | Olsson | 363/123 |
| 4,578,745 | 3/1986 | Olsson | 363/68 |
| 4,583,158 | 4/1986 | Ikekame | 363/68 |
| 4,618,923 | 10/1986 | Meisel et al. | 363/144 |
| 4,631,656 | 12/1986 | Olsson | 363/123 |
| 4,675,720 | 6/1987 | Ikegame et al. | 357/75 |
| 4,816,980 | 3/1989 | Wiendl | 363/35 |
| 5,117,346 | 5/1992 | Gard | 363/51 |

Primary Examiner—Steven L. Stephan
Assistant Examiner—Adolf Berhane
Attorney, Agent, or Firm—Watson, Cole, Grindle & Watson

[57] ABSTRACT

The invention relates to a new arrangement of at least one valve stack (2) for high voltage direct current in a valve hall (1). Said valve stack (2) has a voltage to ground which, in operation, increases along the stack (2). The invention comprises arranging the stack (2) in a substantially lying position at such a distance from the floor and roof (9), respectively, of the valve hall (1) that the smallest electrical flashover distance between live parts on the stack (2) and said floor and roof (9), respectively, is at least contained. Further, the electrical connection is arranged via bushings through the roof (9) of the valve hall (1).

5 Claims, 4 Drawing Sheets

A-A

ARRANGEMENT OF A VALVE STACK FOR HIGH VOLTAGE DIRECT CURRENT IN A VALVE HALL

It is known that in a valve hall for generation of high voltage direct current, the elongated stacks of rectifier valves may be positioned vertically in an upright or suspended manner. So far, this has been considered to lead to the lowest cost for valves and valve hall. However, for economic reasons, the necessary bushings must be placed in the walls of the hall in such an arrangement. The bushings will then have an almost horizontal extension and will be positioned, at least partially, in the rain shadow of the roof of the valve hall. In case of direct voltage levels in excess of about 400 kV, this may lead to flashover caused by dirt, which is due, in part, to that part of the insulator of the bushing, which lies in the rain shadow, not being cleaned by precipitation, and, in part, to the lower side of the horizontal insulator also being protected against rain and consequently risking a continuous "stripe of dirt" on the surface. To prevent this, it has hitherto been necessary to grease the bushings—an action which has been looked upon with great disapproval by the plant owner since it has constituted a heavy part of the maintenance of the valve hall and has made a high voltage direct current plant appear particularly maintenance-demanding in comparison with an alternating current plant.

It is known from experience that insulators which are placed vertically outside the rain shadow run a very small risk of flashover up to a direct voltage of at least 600 kV. Thus, it should be a suitable solution to place all the bushings on the roof, but in known arrangements of valve stacks this infallibly leads to a considerably larger valve hall with an ensuing higher total cost.

According to the invention, there is now proposed a new method of placing the valve stacks in the valve hall. This method permits the bushings to extend through the roof without the volume of the valve hall having to be increased. The invention comprises arranging each valve stack, which is composed of a number of electrically series-connected valve modules arranged one after the other and which in operation have a voltage to ground which increases along the stack, in a substantially lying position. The valve stack is to lie at such a distance from the floor and roof of the valve hall, respectively, that the smallest electrical flashover distance between live parts on the stack and the floor and roof, respectively, is contained and that electrical connection to the stack is arranged at bushings through the roof of the valve hall. In principle, this means that the entire valve hall is overturned, so to speak, and, contrary to prior art arrangements, its volume need not be increased in spite of the fact that all the bushings—both for alternating and direct voltage—have now been arranged through the roof.

According to a special alternative, the volume of the valve hall may even be reduced if the roof of the valve hall is made sloping towards the horizontal plane and this is combined with the fact that the flashover voltage to ground increases along the valve stack from one end thereof to the other.

The volume of the hall may be further reduced if the valve stack is suspended in such a way that the distance between live points on the valve stack and the roof and floor, respectively, of the valve hall is only kept somewhat greater than the current flashover distance between the corresponding points and the roof and floor, respectively, of the valve hall.

A further simplification of the erection may be made if three valve stacks in a valve hall are arranged in a star- or Y-configuration with the high voltage ends of the valve stacks brought together and electrically interconnected at the center of the star and connected to a common bushing for the high voltage direct current. In addition to this embodiment providing a saving of bushings, the volume of the hall may be further reduced by the roof now being given a dome-like shape which makes it possible to make all the walls in the hall lower in comparison with an arrangement in which the stacks are suspended in a lying, but parallel, manner. In the latter case, the whole wall of the hall against the high voltage end of the stacks must be made considerably higher than the corresponding wall at the low voltage end.

Figure 2:
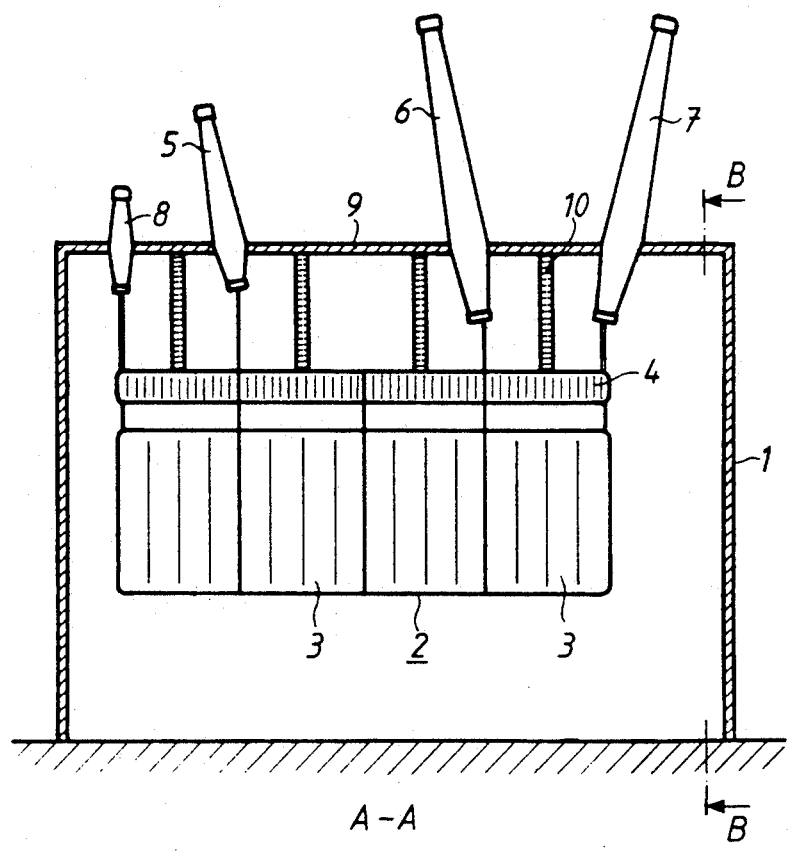
Figure 4:
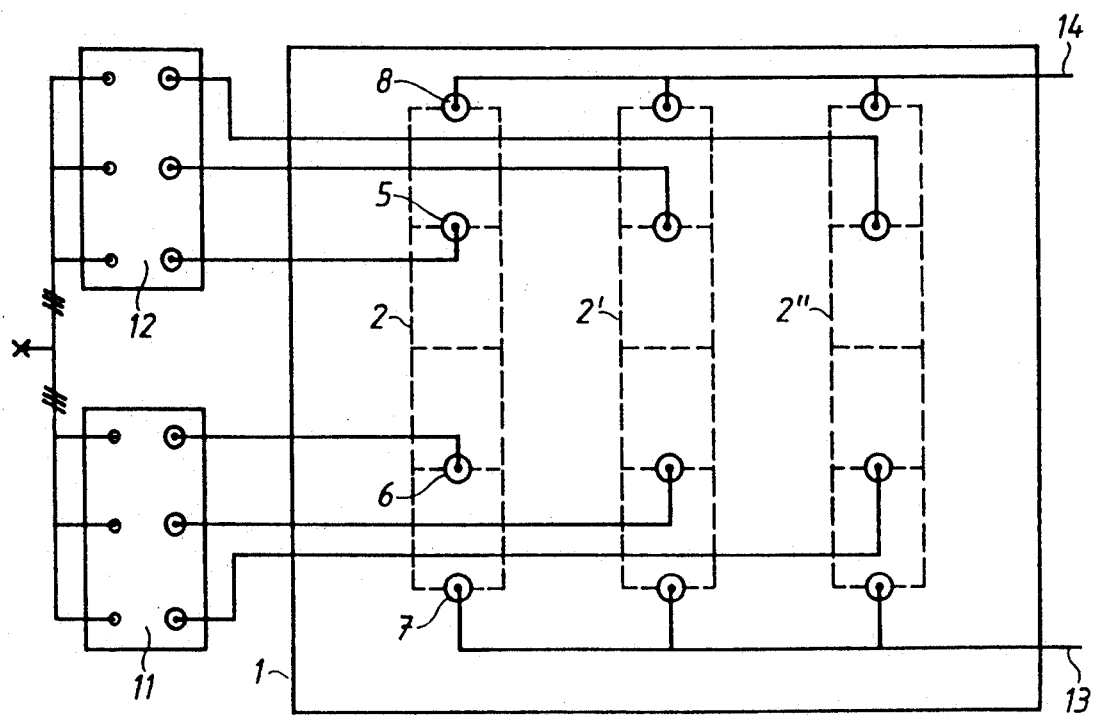
Figure 5:
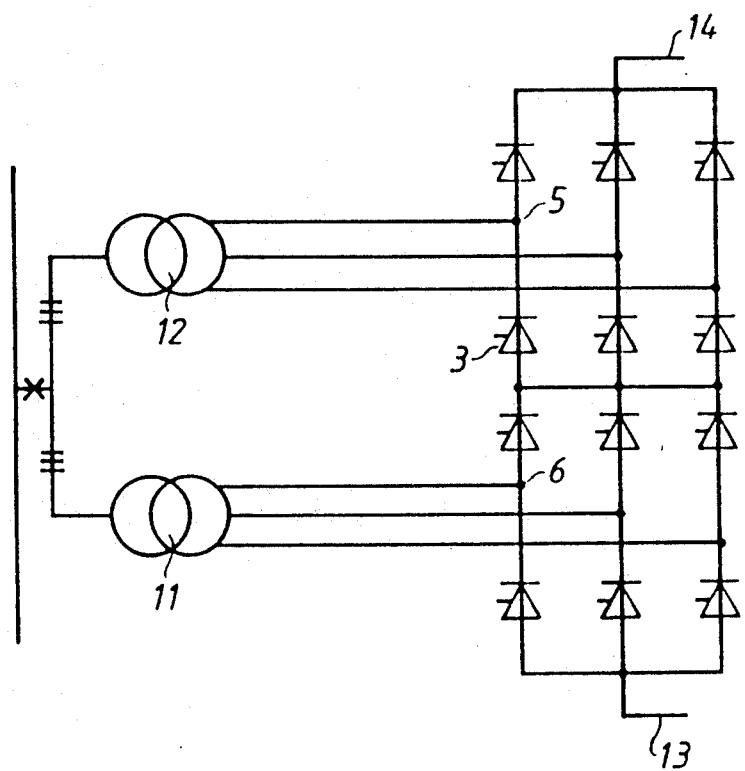
Figure 6:
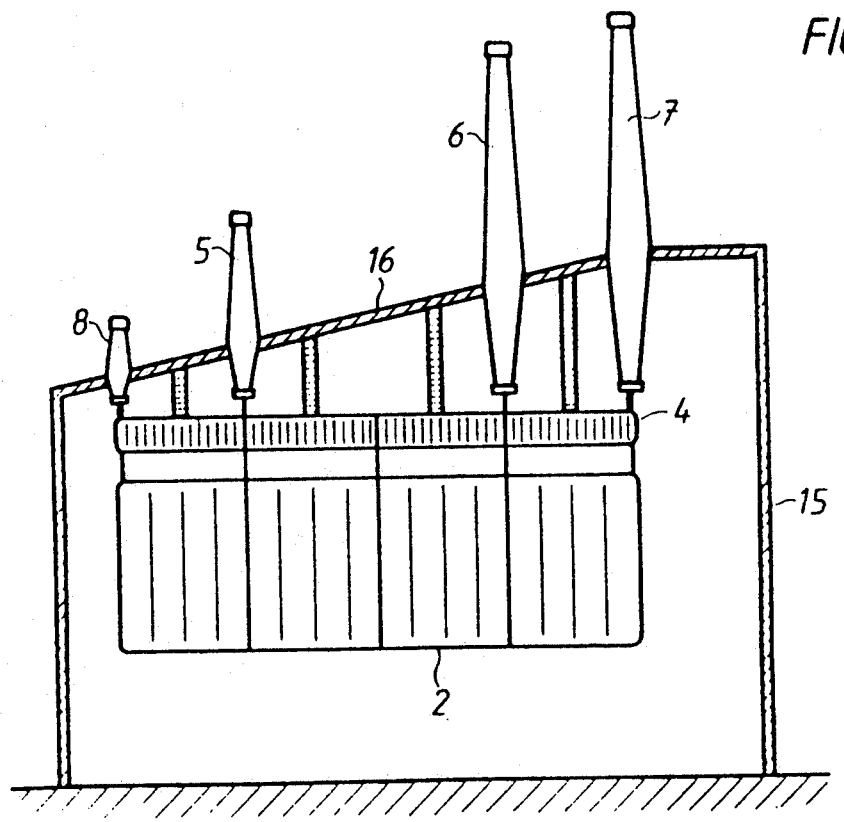
Figure 7:
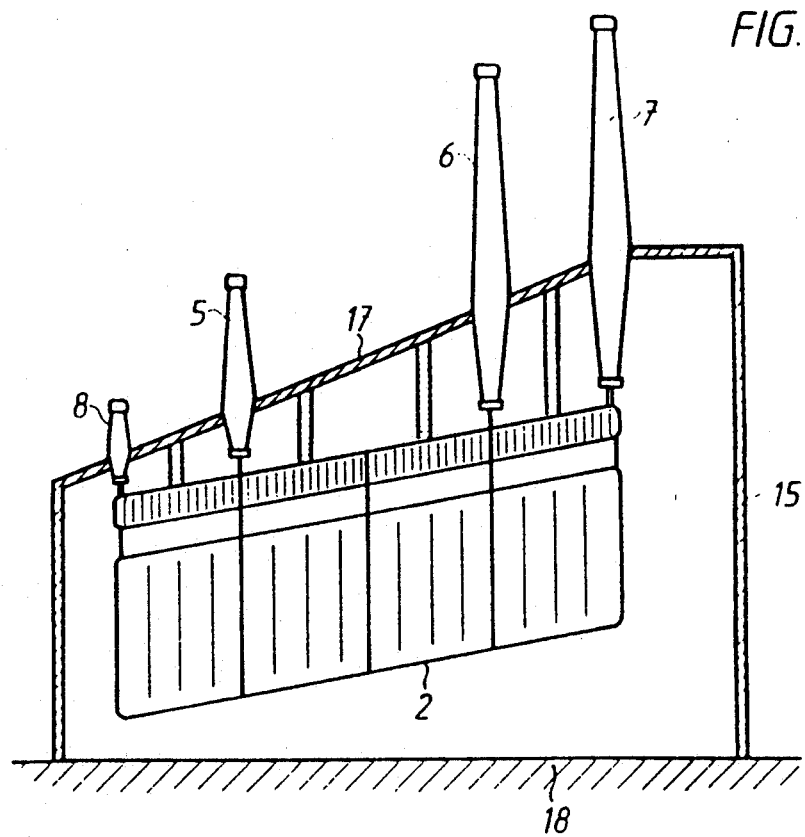
Figure 8:
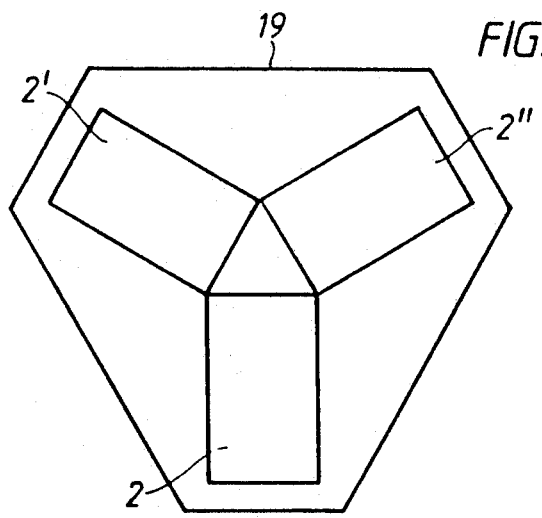
Figure 9:
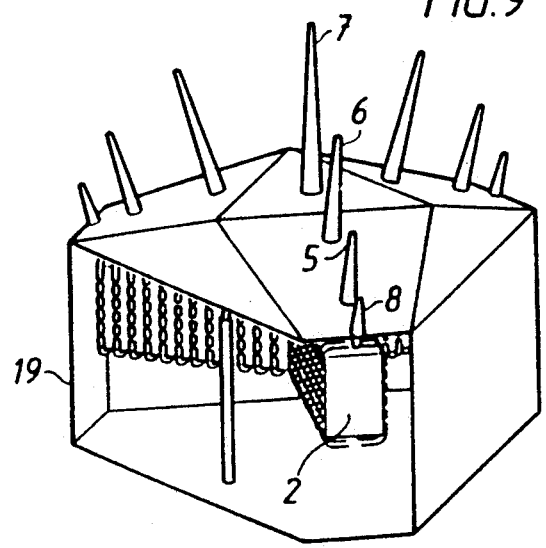

The invention will be best understood with reference to the accompanying drawings, in which FIG. 1 shows a side view of the valve hall which is commonly used today, FIG. 2 shows a proposal for a new arrangement of the valve stacks in a valve hall. FIG. 2 is a section of A—A in FIG. 3, FIG. 3 shows a section of B—B in FIG. 2, FIG. 4 shows the valve hall according to FIGS. 2 and 3 seen from above with transformers, not shown in FIGS. 2 and 3, FIG. 5 shows a wiring diagram for the rectifier station according to FIG. 4, FIG. 6 shows an embodiment with a sloping roof of the valve hall, FIG. 7 shows a combination of a sloping roof and an obliquely suspended valve stack, FIG. 8 shows the principle of a star-shaped arrangement of lying valve stacks, and FIG. 9 shows a possible embodiment of a valve hall for such an erection or suspension of the valve stacks.

In FIG. 1, 1 designates the valve hall and 2 a valve stack for high voltage direct current suspended therein. The valve stack 2 is composed of electrically series-connected valve modules 3 which are bridged by overvoltage protective means 4. The valve stack 2 is supplied from a transformer (not shown) via the bushings 5 and 6. The bushing 7 is intended for connection to a line or cable for high voltage direct current whereas the low voltage side of the valve stack 2 is intended to be connected, via the bushing 8, to the electrode (not shown) of the direct current transmission. The valve stack 2 is suspended from the roof 9 of the valve hall by means of suspension insulators 10. In this type of valve halls, thus, the risk of flashover caused by dirt across the bushing 7 is great at direct voltage levels above 400 kV. This is due to the fact that, especially in case of certain wind directions, the bushing 7 comes within the rain shadow of the high building.

With regard to FIG. 2, it may be said that, in principle, the valve hall 1 and the valve stack 2 have been overturned so that both of them can now be said to be lying down instead of standing on edge. For the sake of simplicity, the objects in FIG. 2 have been given the same designations as those in FIG. 1. By the lying arrangement of the valve stack 2, the bushings 5-8 may be placed vertically on the roof 9 of the valve hall 1 without the volume of the valve hall 1 having to be increased and without the total cost of the plant increasing.

Figure 3:
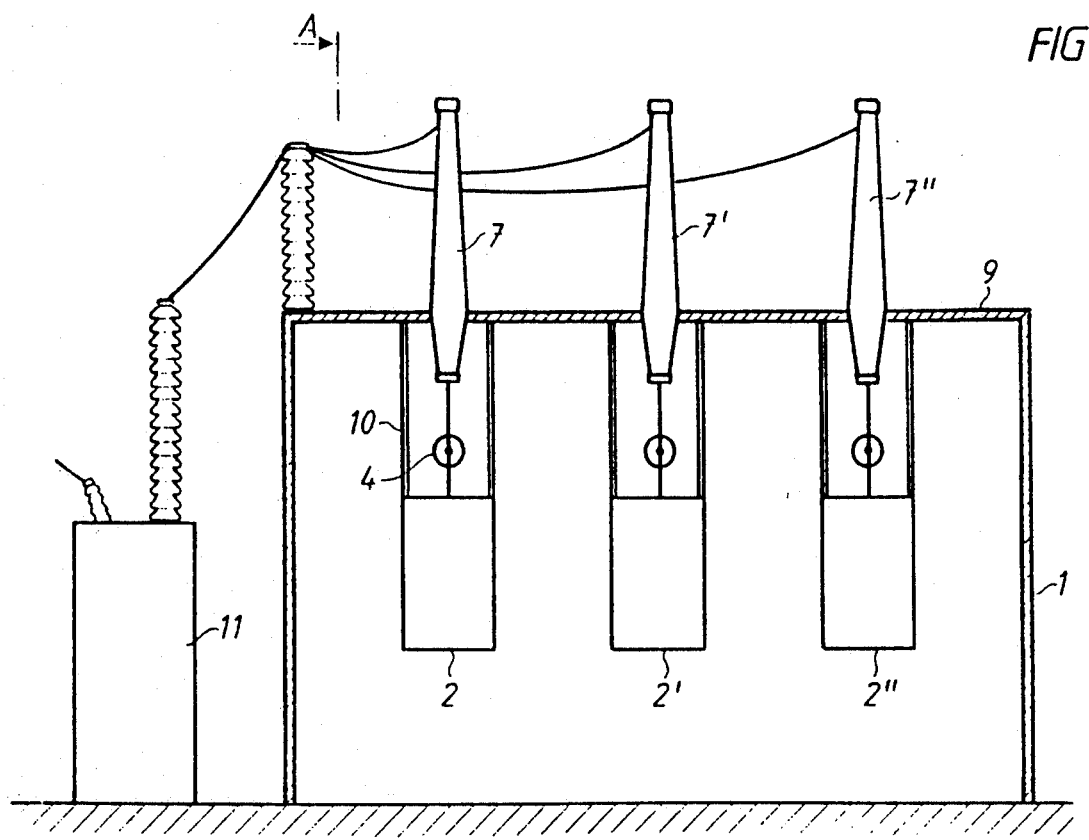

FIG. 3 shows, as mentioned, a section B—B of FIG. 2. In FIG. 3 the same designations as before are still used. FIG. 3 shows two additional valve stacks 2' and 2" which together with the valve stack 2 form a complete rectifier station. This is supplied with alternating current from the transformer 11, the high voltage side of which has been connected to the bushings 6 according to FIG. 2. These bushings 6 are in FIG. 3 concealed by the bushings 7.

FIG. 4 shows the same valve hall 1, seen from above. In FIG. 4, 12 designates a additional transformer which supplies the valve stacks 2, 2' and 2" via the bushings 5. The line 13 leads to a line for the high voltage direct current transmission, whereas the line 14 leads to an electrode for the corresponding transmission.

FIG. 5 shows an electric wiring diagram for a plant according to FIG. 4.

FIG. 6 shows a valve hall 15 with a sloping roof over the suspended valve stack 2. In this arrangement of the valve stack 2 the circumstance has been utilized that the voltage at one end of the valve stack 2 is low and then increases to high voltage at the other end of the stack 2. Consequently, the distance to the roof 16, i.e. to ground, may be allowed to be smaller at the low voltage end of the valve stack 2 than at its high voltage end. The volume of the valve hall 15 may thus be reduced in relation to the embodiment described above.

FIG. 7 shows another possible modification. Here, it has been possible to make the roof 17 of the valve hall 15 with an even greater slope than in FIG. 6. This is due to the fact that, in suspending the stack 2, account has been taken of the fact that a lower distance between the low voltage end of the valve stack 2 and the floor of the valve hall, in relation to the corresponding necessary distance at the high voltage end, can also be allowed. As will be clear from FIG. 7, this means that the valve stack 2 is arranged such that the distance between live points on the valve stack 2 and the roof 17 and floor 18, respectively. of the valve hall 15 is kept somewhat greater than the current flashover distance between the corresponding points and the roof 17 and floor 18, respectively.

FIG. 8 shows the principle of a star-shaped arrangement of the valve stacks 2, 2' and 2" in a valve hall 19, The valve stacks are here arranged with their high voltage ends converging at the center of the star. This means that a common bushing for the high voltage direct current may be used and that the largest necessary insulation distance to ground for the three valve stacks will be in common.

If this is taken into consideration, the valve hall 19 may advantageously be given the shape as shown in FIG. 9. As will be clear from this FIG. the valve hall 19 has here a dome-like shape with long side walls all around as a consequence of the low voltage ends of the stacks 2 facing the wall of the hall whereas their high voltage ends, so to speak, share the insulation distance from the center of the star to the highest point of the domed roof. If, in addition, the stacks were to be suspended as shown in FIG. 7, it would be possible to make the side walls even lower, thus saving additional valve hall volume.

We claim:

1. An arrangement of at least one elongated valve stack (2) for high voltage direct current in a valve hall (1), which said valve stack (2) is composed of a number of electrically series-connected valve modules (3) arranged one after the other, said valve stack (2) being provided with d.c. terminals (13, 14) at the ends of the valve stack (2) and at least one a.c. terminal between said ends and, in operation, having a voltage to ground which increases along the stack (2), wherein the stack (2) is arranged in a substantially lying position and at such a distance from the floor and roof (9), respectively, of the valve hall (1) that the smallest electrical flashover distance between live parts on the valve stack (2) and said floor and roof (9), respectively, is contained, and that electrical connection to the valve stack, (2) is arranged via bushings through the roof (9) of the valve hall (1).

2. An arrangement according to claim 1, wherein the valve stack (2) is arranged suspended from the roof (9) of the valve hall (1) by means of suspension insulators (10).

3. An arrangement according to claim 1, wherein at least that part of the roof (9) of the valve hall (1) which lies directly over a valve stack (2) is made sloping towards the horizontal plane.

4. An arrangement according to claim 3, wherein the distance between live points on the valve stack (2) and the roof (9) and floor, respectively, of the valve hall (1) is somewhat greater than the current flashover distance between the corresponding points and said roof (9) and floor, respectively.

5. An arrangement according to claim 1, including three valve stacks (2) arranged in a Y-configuration with the high voltage ends of the stacks (2) interconnected at the node of the Y and connected to a common high voltage bushing.

* * * * *